(12) United States Patent
Milicevic et al.

(10) Patent No.: US 9,593,037 B2
(45) Date of Patent: Mar. 14, 2017

(54) APPARATUS AND METHOD FOR CARRYING OUT A PLASMA DEPOSITION PROCESS

(71) Applicant: Draka Comteq B.V., Amsterdam (NL)

(72) Inventors: Igor Milicevic, Amsterdam (NL); Mattheus Jacobus Nicolaas Van Stralen, Amsterdam (NL); Johannes Antoon Hartsuiker, Amsterdam (NL); Gertjan Krabshuis, Amsterdam (NL)

(73) Assignee: Draka Comteq B.V., Amsterdam (NL)

( * ) Notice: Subject to any disclaimer, the term of this patent is extended or adjusted under 35 U.S.C. 154(b) by 0 days.

(21) Appl. No.: 14/715,726

(22) Filed: May 19, 2015

(65) Prior Publication Data

US 2015/0336837 A1 Nov. 26, 2015

(30) Foreign Application Priority Data

May 22, 2014 (NL) .................................... 2012857

(51) Int. Cl.
| | | |
|---|---|---|
| *C03B 37/018* | (2006.01) | |
| *C23C 16/04* | (2006.01) | |
| *C23C 16/40* | (2006.01) | |
| *C23C 16/511* | (2006.01) | |

(52) U.S. Cl.
CPC ........ *C03B 37/0183* (2013.01); *C03B 37/018* (2013.01); *C23C 16/045* (2013.01); *C23C 16/401* (2013.01); *C23C 16/511* (2013.01); *C03B 2201/12* (2013.01); *C03B 2201/31* (2013.01)

(58) Field of Classification Search
CPC .............. C03B 37/018; C03B 37/0183; C03B 2201/12; C03B 2201/31
See application file for complete search history.

(56) References Cited

U.S. PATENT DOCUMENTS

| | | | |
|---|---|---|---|
| 2010/0154479 A1 | 6/2010 | Milicevic et al. | |
| 2013/0067960 A1* | 3/2013 | Milicevic .............. | C03B 37/018 65/391 |

FOREIGN PATENT DOCUMENTS

| | | | |
|---|---|---|---|
| EP | 2 199 263 A1 | 6/2010 | |
| EP | 2 377 825 A1 | 10/2011 | |
| EP | 2 573 056 A2 | 3/2013 | |
| EP | 2 594 659 A1 | 5/2013 | |
| NL | EP 2199263 A1 * | 6/2010 | ........ C03B 37/01807 |

OTHER PUBLICATIONS

European Search Report dated Sep. 25, 2015 for EP 15 16 5116.

* cited by examiner

*Primary Examiner* — Queenie Dehghan
(74) *Attorney, Agent, or Firm* — Shumaker, Loop & Kendrick, LLP

(57) ABSTRACT

A method for carrying out a plasma deposition process including the steps of providing a substrate tube, supplying dopant-containing glass-forming gases to the substrate including a main gas flow and one or more secondary gas flows, inducing a plasma in the substrate tube, moving a reaction zone back and forth in strokes between a reversal point near the supply side and a reversal point near the discharge side, and interrupting the secondary gas flow during a portion of each stroke, each interruption having a start point and an end point within the same stroke.

15 Claims, 3 Drawing Sheets

APPARATUS AND METHOD FOR CARRYING OUT A PLASMA DEPOSITION PROCESS

TECHNICAL FIELD AND BACKGROUND OF THE INVENTION

The present invention relates a method for carrying out a plasma deposition process including the steps of:
i) providing a hollow substrate tube;
ii) supplying a supply flow of dopant-containing glass-forming gases to the substrate tube of step i), wherein the supply flow comprises a main gas flow and one or more secondary gas flows, preferably said main gas flow mainly comprising the glass-forming gases and said one or more secondary gas flows mainly comprising precursors for dopant(s);
iii) inducing a plasma by means of electromagnetic radiation in at least a part of the substrate tube of step ii) to create a reaction zone in which deposition of one or more glass layers onto the interior surface of the substrate tube takes place;
iv) moving the reaction zone back and forth in longitudinal direction over the substrate tube between a reversal point located near the supply side and a reversal point located near the discharge side of said substrate tube; wherein each forth and each back movement is called a stroke;
wherein the flow of at least one secondary gas flow is interrupted one or multiple times during step iii); each of said interruptions having a start point and an end point as a function of the axial position of the plasma along the length of the substrate tube.

Plasma-enhanced chemical vapor deposition (PECVD or PCVD) is a process used to deposit thin films from a gas state (vapor) to a solid state on a substrate. Chemical reactions are involved in the process, which occur after creation of a plasma of the reacting gases.

Generally, in the field of optical fibers, multiple thin films of glass are deposited on the inside surface of a substrate tube. Glass-forming gases (viz. doped or undoped reactive gases) are introduced into the interior of the substrate tube from one end (supply side of the substrate tube). Doped or undoped glass layers are deposited onto the interior surface of the substrate tube. The gases are discharged or removed from the other end of the substrate tube, optionally by the use of a vacuum pump (discharge side of the substrate tube). The vacuum pump has the effect of generating a reduced pressure in the interior of the substrate tube, which reduced pressure generally comprises a pressure value ranging between 5 and 50 mbar.

Generally, electromagnetic radiation from generator is directed towards an applicator via a waveguide, which applicator surrounds a substrate tube. The applicator couples the electromagnetic energy into the plasma. The applicator (and hence the plasma formed by that) is moved reciprocally in the longitudinal direction of the substrate tube, as a result of which a thin glass layer is deposited onto the interior of the substrate tube with every stroke or pass.

The applicator and the substrate tube are generally surrounded by a furnace so as to maintain the substrate tube at a temperature of 900-1300° C. during the deposition process.

Thus the applicator is moved in translation over the length of the substrate tube within the boundaries of the furnace. With this translational movement of the resonator the plasma also moves in the same direction. As the resonator reached the inner wall of the furnace near one end of the substrate tube, the movement of the resonator is reversed so that it moves to the other end of the substrate tube towards the other inner wall of the furnace. The resonator and thus the plasma travels a back and forth movement along the length of the substrate tube. Each movement of the applicator from one reversal point to another reversal point is called a "pass" or "stroke". With each pass a thin layer of glass is deposited on the inside of the substrate tube.

Normally, a plasma is generated only in a part of the substrate tube, viz. the part that is surrounded by the microwave applicator. The dimensions of the applicator are smaller than the dimensions of the furnace and of the substrate tube. Only at the position of the plasma, the reactive gasses are converted into solid glass and deposited on the inside surface of the substrate tube.

When the number of passes increases the cumulative thickness of these thin films, i.e. of the deposited material, increases thus leading to a decrease in the remaining internal diameter of the substrate tube. In other words, the hollow space inside the substrate tube keeps getting smaller with each pass.

One way of manufacturing an optical preform by means of a PCVD process is known from U.S. Pat. No. 4,314,833. According to the process that is known from that document, one or more doped or undoped glass layers are deposited onto the interior of a substrate tube, using a low-pressure plasma in the glass substrate tube. After the glass layers have been deposited onto the interior of the glass substrate tube, the glass substrate tube is subsequently contracted by heating into a solid rod ("collapsing"). In a special embodiment, the solid rod may furthermore be externally provided with an additional amount of glass, for example by means of an external vapor deposition process or by using one or more preformed glass tubes, thus obtaining a composite preform. From the preform thus produced, one end of which is heated, optical fibers are obtained by drawing.

According to International application WO 99/35304 in the name of the present applicant, microwaves from a microwave generator are directed towards an applicator via a waveguide, which applicator surrounds a glass substrate tube. The applicator couples the microwave energy into the plasma.

U.S. Pat. No. 4,741,747 relates to methods for reducing optical and geometrical end taper in the PCVD process. The regions of non-constant deposition geometry at the ends of the preform (taper) are reduced by moving the plasma in the area of at least one reversal point nonlinearly with time and/or by changing the longitudinal extent of the plasma as a function of time.

EP 2 573 056 relates to a method for manufacturing a primary preform having a reduced taper.

From European patent application EP 2199263 (also published as US 2010/0154479) by the present applicant is known a PCVD process which can be used to minimize axial refractive index variations along a substrate tube by controlling the gas composition (primarily dopant composition) in the substrate tube as a function of the resonator (plasma zone) position. This system is complicated to build and maintain.

From European patent application EP 2 377 825 of the present applicant is known a process for manufacturing a primary preform wherein pulses of a fluorine containing gas are supplied when the reaction zone is at the reversal point.

From European patent application EP 2 594 659 of the present applicant is known an apparatus for carrying out a PCVD deposition process, wherein one or more doped or undoped glass layers are coated onto the interior of a glass substrate tube, which apparatus comprises an applicator having an inner wall and an outer wall and a microwave guide which opens into the applicator, which applicator extends around a cylindrical axis and which is provided with a passage adjacent to the inner wall, through which the microwaves supplied via the microwave guide can exit, over which cylindrical axis the substrate tube can be positioned, whilst the applicator is fully surrounded by a furnace that extends over said cylindrical axis.

From European patent application EP 1,923,360 (also published as US 2009/0022906) of the present applicant a PCVD process is known which provides uniform thickness and refractive index deposition in the axial direction of the substrate tube. In this method the furnace is moved reciprocally, e.g. 30 mm, 60 mm, or 15 mm, along the axial direction of the substrate tube. The movement of the furnace is used to reduce the effect of what is believed to be non-uniform distribution of microwave power along the axial direction of the substrate tube, caused by microwave applicator position-dependent reflections of some of the microwave power, e.g. from the inner wall of the surrounding furnace. Such axial microwave power non-uniformity can cause axial deposition thickness and refractive index non-uniformity, which adversely affects fiber quality parameters such as attenuation, mode field width uniformity, and bandwidth uniformity.

BRIEF SUMMARY OF THE INVENTION

An aspect of the present invention is to provide a substrate tube having vapor-deposited glass layers of essentially uniform thickness and an essentially uniform refractive index profile in the axial direction, which substrate tube is subsequently further processed into a solid rod via a contraction process. Finally, said solid rod is converted into an optical fiber via a number of processing steps.

The present invention relates to a method for carrying out a plasma deposition process, said method comprising the steps of:

i) providing a hollow substrate tube;
ii) supplying a supply flow of dopant-containing glass-forming gases to the substrate tube of step i), wherein the supply flow comprises a main gas flow and one or more secondary gas flows, preferably said main gas flow mainly comprising the glass-forming gases and said one or more secondary gas flows mainly comprising precursors for dopant(s);
iii) inducing a plasma by means of electromagnetic radiation in at least a part of the substrate tube of step ii) to create a reaction zone in which deposition of one or more glass layers onto the interior surface of the substrate tube takes place;
iv) moving the reaction zone back and forth in longitudinal direction over the substrate tube between a reversal point located near the supply side and a reversal point located near the discharge side of said substrate tube; wherein each forth and each back movement is called a stroke;

wherein the flow of at least one secondary gas flow is interrupted one or multiple times during step iii); each of said interruption having a start point and an end point as a function of the axial position of the plasma along the length of the substrate tube; and
wherein the start point and end point of each of the one or more interruptions lie within the same stroke.

In one embodiment, the at least one secondary gas that is interrupted comprises a precursor for a germanium dopant.

In another embodiment, the at least one secondary gas that is interrupted comprises a precursor for a germanium dopant being $GeCl_4$.

In yet another embodiment, the interruption during a stroke has a duration of maximally 10% of the total time of said stroke.

In the context of the present invention, "interruption during a stroke has a duration" is meant that the duration of one interruption in case there is only one interruption or in case there is more than one interruption, the sum of the duration of each interruption. For example, if there are 10 interruptions in one stroke and each interruption has a duration of 50 millisecond, then the interruption during a stroke has a duration of 500 millisecond, viz. 0.5 second. Then when the duration of a stroke is 5 seconds, than the interruption during a stroke has a duration of 0.5/5=10% of the total time of said stroke. In other words, the at least one secondary gas that is interrupted flows for 90% of the time of said stroke and is interrupted for 10% of the time of said stroke.

In yet another embodiment, the interruption during a stroke has a duration of less than 10% of the total time of said stroke.

In yet another embodiment, the interruption during a stroke has a duration of less than 5% of the total time of said stroke.

In yet another embodiment, the interruption during a stroke has a duration of less than 2.5% of the total time of said stroke.

In yet another embodiment, the interruption during a stroke has a duration of less than 1.5% of the total time of said stroke.

In yet another embodiment, the interruption during a stroke has a duration of more than 0.5%, such as more 1.0%, for example more than 1.5% or even more than 2.0% of the total time of said stroke.

In yet another embodiment, during multiple strokes, the one or more interruptions are applied at the same axial position.

In yet another embodiment, the one or more interruptions are applied in a fraction of the strokes of a phase. For example, the one or more interruptions are applied only in the forward strokes of a phase. Or the one or more interruptions are applied in a certain protocol wherein during strokes X, X+10, X+20, X+30, X+40 etc. said interruption(s) are applied.

In yet another embodiment, the interruptions are applied in at most 75% of the strokes.

In yet another embodiment, the interruptions are applied in between 5% and 75% of the strokes.

In yet another embodiment, the interruptions are applied in the strokes when the reaction zone moves from supply side to discharge side (forward stroke).

In another embodiment, the interruptions are applied in the strokes when the reaction zone moves from supply side to discharge side (forward strokes) and in the strokes when the reaction zones moves from the discharge side to the supply side (backward strokes). In this embodiment a different interruption protocol may be used for the forward strokes and the backward strokes or the same interruption protocol may be used. An interruption protocol describes the number, duration and axial position of the interruptions. It should be noted that when the same interruption protocol is used for the forward and backward strokes, the lag phase (y) as discussed above will ensure that on the forward stroke, when the gas flow is interrupted on an axial position x, an effect on the refractive index is observed at x+y whereas on the backward stroke, an effect on the refractive index is observed at x−y because the applicator moves in a different direction. The use of interruptions on both the forward and backward strokes has been observed to lead to a decrease in the attenuation, which is desirable. In particular, when the same interruption protocol is used for the forward and backward movement.

In yet another embodiment, within one stroke a plurality of interruptions are applied.

In yet another embodiment, a controllable valve is present in the flow path of the at least one secondary gas flow, with the controllable valve blocking or passing the respective gas flow.

In yet another embodiment, the control frequency used for controlling the controllable valve is at least 20 Hz.

In yet another embodiment, the control frequency used for controlling the controllable valve is at least 50 Hz.

In yet another embodiment, the control of the controllable valve(s) takes place as a function of an axial position of the reaction zone in the substrate tube in step iii), especially that said control takes place by comparing a previously determined refractive index profile in axial direction with a desired refractive index profile, the difference between the two profiles functioning as a basis for interrupting the gas flow of at least one secondary gas flow.

In another embodiment, step i) is preceded by a calibration step o); wherein step o) comprises the following sub steps:
 a) providing a calibration substrate tube;
 b) obtaining a refractive index profile as a function of the axial position along the length of the substrate tube;
 c) comparing said refractive index profile thus obtained with a desired refractive index profile; and
 d) determining one or more axial position at which the at least one secondary gas flow it to be interrupted, being predetermined axial interruption positions.

It should be noted that in this embodiment, the calibration is carried out once and subsequently, the steps i)-iv) may be carried out multiple times. In other words, one calibration is sufficient to determine the axial interruption positions that may be used for steps i)-iv) of several cycles.

In other words, the at least one controllable valve supplying the at least one secondary gas flow to be interrupted is controlled according to the axial position of the reaction zone in the substrate tube in step iii). Preferably, the controllable valve is switched to the closed position on one or more axial positions corresponding to one or more predetermined axial interruption positions.

A key to the present invention is a short interruption of at least one of the secondary gas flows during one or more strokes in order to reduce deviations in the thickness and/or refractive index in axial direction of the preform obtained. The invention allows to actively influence the refractive index of the preform at every given axial position.

One or more of the above aspects are accomplished by using the present apparatus and method.

BRIEF DESCRIPTION OF THE DRAWINGS

The present invention is described below in detail with reference to the drawings in which.

DETAILED DESCRIPTION OF THE INVENTION

Figure 1:
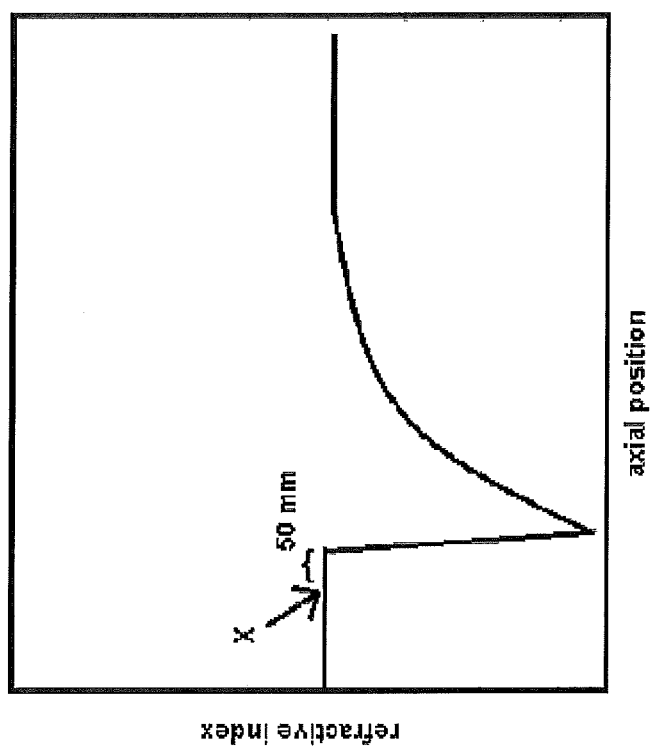
FIG. 1 shows a graph of the refractive index (y-axis) versus the axial position (x-axis) of one single pass where the flow of Germanium tetrachloride interrupted.

The following definitions are used in the present description and claims to define the stated subject matter. Other terms not cited below are meant to have the generally accepted meaning in the field.

"substrate tube" as used in the present description means: an tube having a cavity within. Generally, the inside of said tube is provided (or coated) with a plurality of glass layers during the manufacturing of a preform.

"primary preform" as used in the present description means: a solid rod (solid preform) that requires to be externally provided with extra glass before it becomes a final preform, viz. a solid rod (solid composite preform) that an be directly used for drawing of optical fibers therefrom.

"supply side" as used in the present description means: one side of the substrate tube, being an open end of the substrate tube that is used as inlet for the gases. The supply side is the side opposite to the discharge side.

"supply flow" as used in the present description is a combination of all gas flows that are fed into the substrate tube. In the present invention the supply flow of dopant containing glass forming gasses comprises a main gas flow and at least one secondary gas flow.

"discharge side" as used in the present description means: one side of the substrate tube, being an open end of the substrate tube that is used as outlet for the gases. The discharge side is the side opposite to the supply side.

"glass" as used in the present description means: crystalline or vitreous (glassy) oxide material—e.g. silica ($SiO_2$) or even quartz—deposited by means of a vapour deposition process.

"silica" as used in the present description means: any substance in the form of $SiO_x$, whether or not stoichiometric, and whether or not crystalline or amorphous.

"glass-forming gases" as used in the present description means: reactive gases used during the deposition process to form glass layers. These glass forming gases may comprise a precursor for a dopant. (e.g. $O_2$ and $SiCl_4$ and optionally others).

"main gas flow" as used in the present description means: the part of the supply flow that comprises the glass forming gasses.

"secondary gas flow" as used in the present description means: the part of the supply flow that comprises at least one gas that is a precursor for a dopant.

"precursor for a dopant" as used in the present description means: a compound or composition that, when introduced into glass, become a dopant having an effect of the refractive index of the glass. Precursors for dopants may for example be gasses that react with one or more compounds in the glass-forming gasses to form doped glass layers when vitrified. During the glass deposition the precursor for a dopant is introduced into the glass layers.

"dopant" as used in the present description means: a compound or composition that is present in the glass of the optical fibre and that has an effect of the refractive index of said glass. It can for example be an down dopant, viz. a dopant decreasing the refractive index, such as Fluorine or Boron (e.g. introduced as a precursor in the form of $F_2$, $C_2F_8$ $SF_6$, $C_4F_8$ or $BCl_3$). It can for example be a up-dopant, viz. a dopant increasing the refractive index, such as Germanium (e.g. introduced as a precursor in the form of $GeCl_2$ (germanium dichloride) or $GeCl_4$ (germanium tetrachloride)). Dopants can be present in the glass either in the interstices of the glass (e.g. in the case of F) or they may be present as an oxide (e.g. in the case of Germanium, Aluminium, Phosphorus or Boron).

"reaction zone" as used in the present description means: the zone or axial location wherein the glass-forming reaction or deposition takes place. This zone is formed by a plasma and preferably moves reciprocally along the longitudinal length of the substrate tube.

"reaction conditions" as used in the present invention means: a set of conditions such as temperature, pressure, microwave power that are used to effect the deposition of the glass layers.

"plasma" as used in the present description means: an ionized gas consisting of positive ions and free electrons in proportions resulting in more or less no overall electric charge at very high temperatures. The plasma is induced by electromagnetic radiation.

"plasma deposition process" as used in the present description means: a process in which multiple thin layers of material are deposited on a substrate using a plasma.

"reversal point" as used in the present description means: the axial point or position on the substrate tube at which the movement of the applicator reciprocates. In other words, changes from back to forth and forth to back. It is the turning point of the applicator. The axial point is measured at the middle (longitudinal) of the applicator.

"moved back and forth" as used in the present description means: a reciprocating movement or moving backwards and forwards in a straight line.

"phase" as used in the present description means: a part of the deposition process in which glass layers having a specific refractive index value are deposited. The specific value may the constant or exhibit a gradient. For example, for a simple step index fibre the deposition of the core and the deposition of the cladding are each considered a separate phase.

"stroke" or "pass" as used in the present description means: the movement of the applicator along the length of the substrate tube between one reversal point and another reversal point. When the strokes are counted both a forward stroke and a backward stroke are each counted as 1, so a complete stroke from the reversal point on the supply side to the reversal point on the supply side comprises a forward stroke and a backward stroke and hence comprises 2 strokes.

"forward stroke" as used in the present description means: a stroke or pass from the reversal point near the supply side to the reversal point near the discharge side. In other words, when the reaction zone moves from supply side to discharge side.

"backward stroke" as used in the present description means: a stroke or pass from the reversal point near the discharge side to the reversal point near the supply side. In other words, when the reaction zone moves from discharge side to supply side. "controllable valve" as used in the present description means: a valve present in the gas flow to be interrupted, which valve is controlled by controlling means to block the gas flow or to allow the gas flow to pass.

"control frequency" as used in the present description means: the frequency with which the gas flow is interrupted.

Thus, the invention relates to a method for carrying out a plasma deposition process. The end product of said method is a preform for drawing optical fibers. Steps of the processes are discussed in detail below.

Step i) relates to providing a substrate tube, preferably a glass substrate tube. Generally, said substrate tube has a supply side and a discharge side. Said substrate tube is preferably of quartz glass.

Step ii) relates to supplying one or more glass-forming gasses to the substrate tube, preferably via the supply side. Generally, the one or more glass-forming gasses are supplied to said substrate tube via a valve system or injection system. Preferably, each of the gasses that used are supplied from the vessel (or other type of container) via a pipe to a mass flow controller (MFC). Each of these MFC's is connected via a pipeline to a valve which can be either in open or in closed position. The addition of the gasses via a MFC allows for the tuning of the amount of gas that is added. The valve used to interrupt the at least one secondary gas flow is located between the MFC and the substrate tube. This means that the secondary gas flow going through the valve and being interrupted is originating from the MFC. This ensures that there is no decrease in the amount of gas when there is an interruption. The interruption merely affects the distribution of the secondary gas not the amount. The MFC allows the predetermined amount of gas to pass through it. When the valve is closed, in other words, during an interruption, the MFC still allows gas to pass, this gas is temporarily stored in the line between the MFC and the valve. When the valve is opened again the flow of the secondary gas is resumed and the gas that was temporarily stored in released into the system. This leads to a temporary increased gas flow. In other words, the interruptions according to the present invention lead to a redistribution of the secondary gas flow, not to a decrease in the secondary gas flow. These gas lines preferably then all come together into combined pipeline that is fed into the substrate tube. In the present invention, the so-called supply flow of dopant containing glass forming gasses comprises a main gas flow and at least one secondary gas flow. Preferably, the main gas flow comprises the glass forming gasses and the at least one secondary gas flow comprises at least one gas that is a precursor for a dopant. Preferably, the gas that is selected to be switched on and off is connected to that combined pipeline via a valve having a orifice. Said valve can be in open or closed position. When the valve is in open position the gas flow is present and when said valve is in closed position, no gas flow is present.

Step iii) relates to inducing a plasma by means of electromagnetic radiation on at least a part of the substrate tube of to create a reaction zone in which deposition of one or more glass layers onto the interior surface of the substrate tube takes place. Preferably the electromagnetic radiation is microwave radiation. By means of the plasma the glass-forming gasses are converted to solid state to form glass layers. Said plasma is preferably induced by an applicator that moves along the substrate tube in forth-and-back movement, this is explained in the following step iv).

Step iv) relates to moving the reaction zone back and forth in longitudinal direction over the hollow substrate tube between a reversal point located near the supply side and a reversal point located near the discharge side of said substrate tube; wherein each forth and each back movement is called a stroke. The deposition process comprises several phases, each phase comprising a plurality of strokes. During one or more of the strokes one or more interruptions of the secondary gas flow are applied according to the method of the present invention. Said interruptions each have a start point (viz. an axial position at which the gas flow is interrupted) and an end point (viz. an axial position at which the gas flow is resumed). These start and end points are a function of the axial position of the plasma along the length of the substrate tube. The interruptions have a certain duration. This duration depends firstly on the location of the start point and end point, viz. the length of the substrate tube over which the applicator is moved during the closure of the valve and secondly, on the speed of movement of the applicator.

The present inventors have found that when the gas flow of a secondary gas (preferably a precursor) is interrupted at least one time during the deposition phase of a plasma deposition process in at least one stroke the deviations in axial direction can be reduced.

A preform for a single mode optical fiber is prepared in a number of phases. For every phase there is a strict specification with respect to the refractive index value and the thickness along the length.

Obtaining uniformity in layer thickness is e.g. carried out by changing the speed of the applicator in certain axial areas. Unfortunately, when using germanium doping, changing the speed of the resonator will inevitably cause a local change in the refractive index because of the temperature dependency of germanium efficiency. This is often not desirable.

When the deposition rate is higher (>2.5 g/min) this effect becomes even stronger. Because the part of the preform which is within specification values decreases with the deposition speed, the total efficiency of the process is severely deteriorated. This stands in the way of increasing the deposition speed as a natural way to increase the machine capacity and to decrease the cost price of the fiber.

The present invention provides a method and apparatus to overcome this problem.

An advantage of this present method when used for preparing single mode optical fibers is that it reduces the deviations in axial direction.

Several embodiments of the present invention will be discussed in more detail below.

Preferably, the gas flow that is interrupted is the gas flow providing germanium dopant or in other words a precursor for germanium doping, such as germanium tetrachloride. The advantage of interrupting germanium instead of Freon is that when Freon is interrupted this could possible lead to an increase in attenuation, which is not desirable.

In another embodiment, the gas flow that is interrupted is the gas flow providing fluorine dopant or in other words a precursor for fluorine doping, such as Freon (e.g. $C_2F_6$).

Preferably, when the gas flow is interrupted on an axial position x, than a sudden drop or increase in the refractive index is observed (when using a up dopant and a down dopant respectively) starting from axial position+lag phase y (mm), e.g. 50 millimeters.) In other words, there is a lag phase of y of a certain number of millimeters, e.g. 50 millimeters. FIG. 1 shows the effect of an interruption when the lag phase is 50 millimeters. A skilled person realizes that such a lag phase depends on the translational speed and direction of the applicator and of the configuration of the tubing for supplying gasses.

Preferably, the duration of an interruption is less than 5%, preferably less than 2.5%, more preferably less than 1.5% of the total time of said stroke. In other words, the valve, also called controllable value is open for the most time (gas flow is allowed to pass) and closed (gas flow is blocked) just at certain axial positions for a certain time period (duration).

Preferably, the duration of an interruption is between 10 and 150 milliseconds, preferably between 20 and 100 milliseconds, such as 50 or 60 or 70 or 80 or 90 milliseconds in order to make sure that the response in the refractive index is as short as possible.

The closed-time of the controllable valve can be expressed by means of the duration of the interruption but also by the frequency of the controllable valve, i.e., the control frequency. Preferably, the control frequency is at least 20 Hz, more preferably at least 50 Hz. This frequency is inversely related to the duration of the interruption. When e.g. the control frequency is set to 20 Hz, the duration of the pulse is 50 milliseconds. When e.g. the control frequency is set to 50 Hz, the duration of the pulse is 20 milliseconds.

In an embodiment, one or more interruptions are provided on each stroke. In other words, at several distinct axial positions interruptions are provided.

In another embodiment, during multiple strokes the one or more interruptions are applied at the same axial position.

In another embodiment, the one or more interruptions are applied in a fraction of the strokes of a phase, viz. in only a certain number of strokes in a phase.

When, e.g. a phase comprises 1000 strokes, it could be envisaged that the interruption(s) are applied every other stroke, e.g. on each forward stroke leading to a total number of interruptions of 500 at a certain axial position or to interruptions in 50% of the strokes. It could also be envisaged that the interruption(s) are applied every ten stroke, e.g. on each fifth forward stroke leading to a total number of interruptions of 100 at a certain axial position or to interruptions in 10% of the strokes. In another embodiment, one or more interruptions are provided only on a fraction of the layers or strokes, such as on at most 75% of the strokes, more preferably between 5% and 75% of the strokes. Preferably, the one or more interruptions are only provided when the reaction zone moves from supply side to discharge side.

Figure 2:
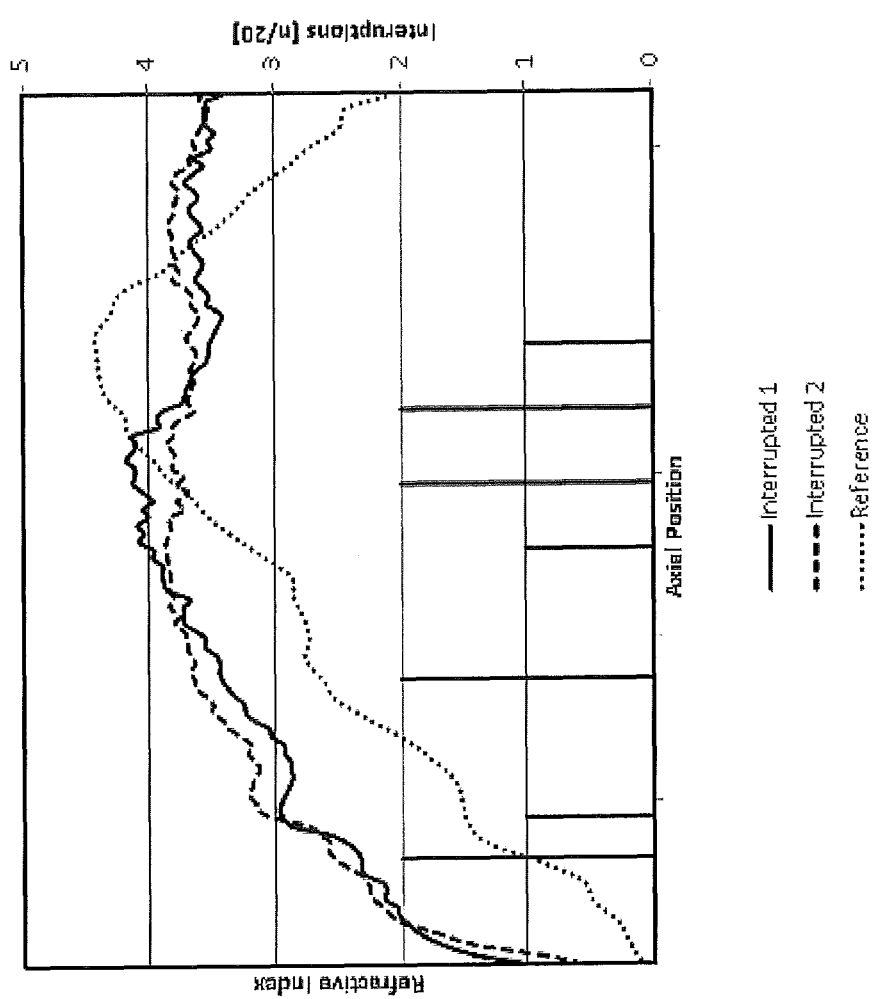
FIG. 2 shows a graph of the effect of the gas interruption system of the present invention using germanium tetrachloride. The graph shows one curve wherein there are no interruptions in the flow of germanium tetrachloride and in the main gas flow and two curves where there are interruptions in the flow of germanium tetrachloride but not in the main gas flow.

In an embodiment, within one stroke a plurality of interruptions is applied. As previously stated, it is possible that interruptions are provided on several distinct axial positions as also shown in FIG. 2.

A scheme of interruptions can be devised wherein the axial position of interruption, the duration of interruption are set for each stroke. For axial positions where a large effect is required, the fraction of the layers or strokes during which the gas flow is interrupted should be higher than when a smaller effect is required. A person skilled in the art is capable of preparing such a interruption scheme.

In an embodiment, a controllable valve is present in the flow path of at least the secondary gas flow that is to be interrupted, more preferably in each gas flow. Said controllable valve is capable of blocking (closed position) or passing (open position) the respective gas flow.

In an embodiment step i) is preceded by a calibration step o); wherein

Step o) comprises the following substeps:
a) providing a calibration substrate tube;
b) obtaining a refractive index profile as a function of the axial position along the length of the substrate tube;
c) comparing said refractive index profile thus obtained with a desired refractive index profile; and
d) determining one or more axial position at which the at least one secondary gas flow has to be interrupted, being predetermined axial interruption positions.

Preferably, there is a sufficient amount of volume in the pipe between the mass flow controller of the gas to be interrupted and the valve in order to act as a buffer. The buffer is preferably of such capacity that the mass flow controller does not notice the closing of the valve. Preferably, the capacity or volume of the buffer is such that when the valve is opened again after being closed, no increased gas flow is observed by deviation of the set refractive index profile (ether a increase or spike in case a precursor is used that increases the refractive index of silica or a decrease of dip in case a precursor is used that decreases the refractive index of silica). In order to increase the buffer capacity, a buffer vessel may be added. Preferably, the buffer capacity is between 200 ml and 1000 ml.

The flow of the gas or the amount of gas introduced into the reaction is preferably determined by the mass flow controller, not by the pressure of the gas line combined with a certain (small) orifice. The orifice may for example have a diameter of between 0.5 and 3 mm, preferably between 1 and 3 mm. The size of the orifice can be selected by a skilled person according to the specific requirements of the apparatus used to prepare the preform. For example, for an apparatus having a MFC that is sensitive for a pressure drop, the size of the orifice can be increased in order to decrease the pressure drop over the MFC.

It should be noted that gas travels through the substrate tube with a speed of for example 10 meters per second. Preferably, the valve connecting the secondary gas flow that is to be interrupted is close to the supply side of the substrate tube, preferably less than 50 centimeters. This allows the reaction to respond quickly to the closing and/or opening of the valve without a lag phase.

Preferably, a fast valve is used. In the present description, a fast valve is a valve that switches between an open position and close position in 10 milliseconds (ms) or less.

More preferably, a very fast valve is used. In the present description, a fast valve is a valve that switches between an open position and a closed position in 5, or even 1 milliseconds (ms) or less.

The formation of glass deposition on the inside of the substrate tube only takes place at the position at which a plasma is present. The glass forming gasses may be doped or may be undoped.

The timing and duration of these interruptions of the gas are determined by the inventors prior to starting the plasma deposition process according to the present invention. In other words, in a calibration process. The inventors use the data obtained from a similar process, that is used as a calibration process, which process uses a similar substrate tube and similar reaction conditions. During such a calibration or test process data is obtained and based on this data the one or more longitudinal or axial positions are determined at which the at least one secondary gas flow should be interrupted. This calibration step or calibration phase will lead to one or more predetermined axial interruption position. The method according to the present invention is then carried out using these predetermined axial interruption position(s). The predetermined axial interruption position(s) is/are determined based on a comparison between the refractive index profile of the calibration substrate tube and the desired refractive index profile. The difference between these two profiles functioning as a basis for interrupting the gas flow of at least one secondary gas flow.

Hence, during the calibration phase the inventors will determine at which longitudinal position of the applicator the interruption of the gas is required. Moreover, the duration of the interruption is determined.

The absolute pressure of the gas in either the main gas flow or the at least one secondary gas flow or both can for example be between 0.5 and 5 bar, preferably between 1 and 2 bar, more preferably approximately 1.5 bar.

In an embodiment of the present invention an additional gas line is attached to the supply side of the substrate tube. By means of a valve, e.g. a so called fast valve, this gas line—for the supply of the switched gas—is coupled to the supply system of glass-forming gasses.

The valve (or fast or very fast valve) can optionally be coupled to controller means, i.e. a microcontroller which measures the position of the applicator and controls the duration of the closing of the valve, it is hence a controllable valve.

The present invention does not required significant changes to the instrumental setup or apparatus that are already in use. Therefore, the solution to the problem presented in the present invention are easy and cost-effective to implement.

In an embodiment of the invention the interruptions are provided during a fraction of or every pass at the same position(s). It is also possible to determine the position for each separate pass or stroke and to adjust the position between passes or strokes. This can be selected depending on e.g. the concentration Germanium or the internal diameter. This ensures the same environment during the complete plasma deposition process to minimize possible perturbations of optical properties if the conditions are changes in between passes.

FIG. 2, which will be discussed in more detail in the Examples, discloses an example of an interruption protocol. Such a protocol specifies the number of interruptions during a specific stroke, the axial position of the interruptions, the duration of the interruptions and the frequency of these interruptions during the deposition process, in other words if the interruptions are during all strokes or during only a few strokes.

In an embodiment, an example of which is shown in FIG. 2, the interruption protocol comprises seven interruptions at seven different axial positions. Three of the seven interruptions (e.g. II, IV, VII) take place once per twenty strokes and the other four (I, III, V, VI) of the eight interruptions take place twice per twenty strokes. In other words, the protocol is as follows: stroke X (interruptions I-VII), stroke X+10 (interruptions I, III, V, VI), stroke X+20 (interruptions I-VII), stroke X+30 (interruptions I, III, V, VI), etc.

It is preferred that if the interruptions are carried out only during part of the strokes in a phase, these interruptions are spaced apart. For example when during a phase of 100 strokes 10 interruptions are provided, it is preferred that every 10 strokes an interruption is provided.

A skilled person will, based on experimentation, be able to decide the most suitable interruption protocol.

As already mentioned previously, a skilled person determines the interruption protocol based on a test or calibration plasma deposition process. Since the phenomenon that occurs is a physical phenomenon, it will occur exactly at the same positions each time provided the wavelength of the microwaves is not changed. This process is completely reproducible irrespective of the width of the original substrate tube used and irrespective of the number of passes used.

If is preferred to deposit layers of glass to a final internal diameter of the substrate tube of maximally 22 millimeters or even to an internal diameter of the substrate tube of maximally 20 millimeters, even more preferably maximally 18 millimeters or even maximally 16 millimeters.

The refractive index value and the thickness of layers deposited inside of the substrate tube thus obtained after internal deposition is substantially uniform along the length thereof.

The present invention will now be explained on the basis of a number of examples, in which connection it should be noted, however, that the present invention is by no means limited to such special examples.

EXAMPLES

Comparative Example 1

With a PCVD process glass layers were deposited on the inside of a substrate tube for the preparation of a core rod for a step index single mode fiber. During the process a gas flow comprising glass forming precursors were supplied to the interior of the substrate tube and a plasma reaction zone was reciprocating inside the tube. First cladding layers were deposited with a refractive index substantially equal to the refractive index of the substrate tube, followed by the deposition of core layers with a refractive index higher than the cladding layers. The increased index was obtained by increasing the concentration of $GeCl_4$ in the gas flow. The flow of $GeCl_4$ was not interrupted during any stroke of the reaction zone during the deposition of core layers.

After the deposition process had been terminated, the substrate tube thus obtained was subjected to a contraction or collapse process so as to obtain a solid rod (primary preform). The dotted line 'reference' in FIG. 2 shows the difference of the refractive index between the core layers and the cladding layers as a function of the length of the primary preform.

Example 1

The same PCVD process as in Comparative Example 1 was used, with this difference that the flow of $GeCl_4$ was interrupted during a fraction of the passes. It should be noted that the main gas flow was not interrupted. The number and axial position of the start of these interruptions per 20 passes is shown in FIG. 2.

The substrate tube thus obtained was formed into a solid rod in the same manner as in comparative example 1. The solid line 'interrupted 1' in FIG. 2 shows the difference of the refractive index between the core layers and the cladding layers as a function of the length of the primary preform.

This was repeated to obtain a second solid rod. The striped line 'interrupted 2' in FIG. 2 shows the difference of the refractive index between the core layers and the cladding layers as a function of the length of the primary preform.

Comparative Example 2

Figure 3:
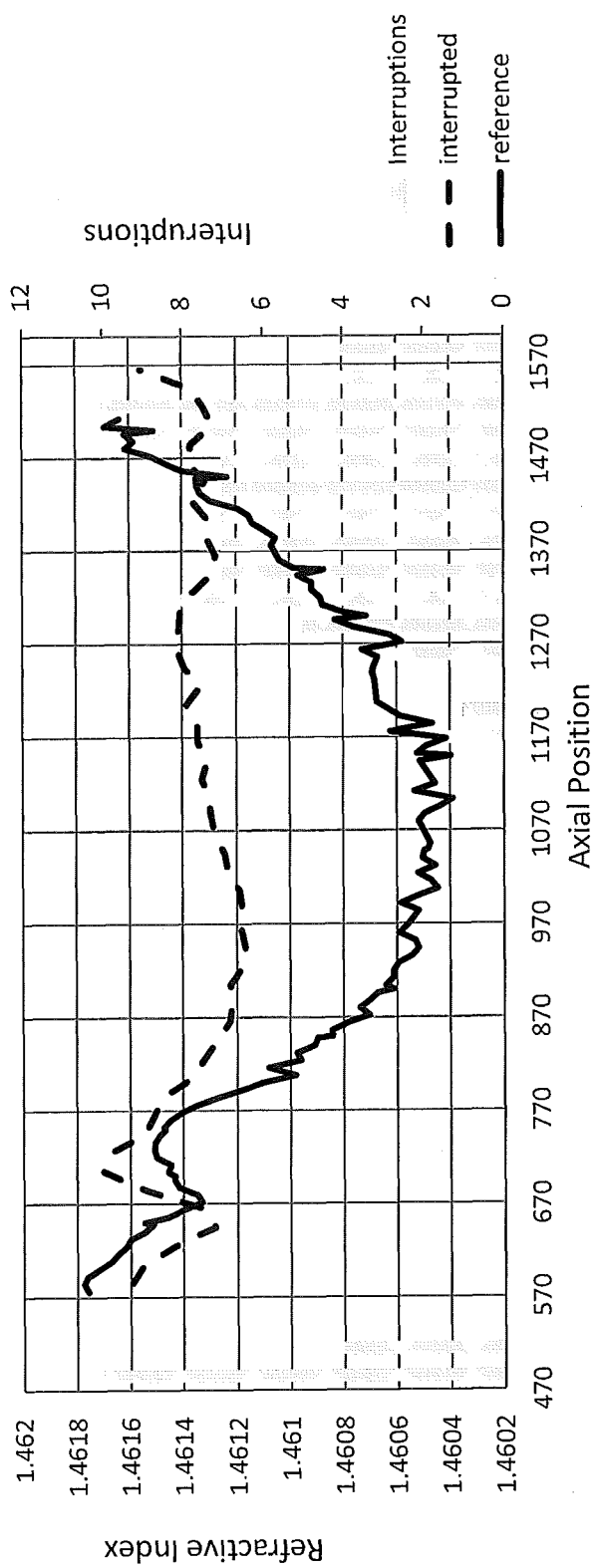
FIG. 3 also shows a graph of the effect of the gas interruption system of the present invention.

The same PCVD process as in Comparative Example 1 was repeated. The curve "Reference" in FIG. 3 shows the difference of the refractive index between the core layers and the cladding layers as a function of the length of the primary preform.

Example 2

The same PCVD process as in Comparative Example 2 was used, with the difference that the flow of $GeCl_4$ was interrupted at several axial positions (9 or 10 times) during each forward stroke for a total of 10 passes (each comprising a forward and back stroke). The backwards strokes were not interrupted. In other words, 50% of the strokes comprised interruptions.

The duration of one forward stroke is 4 seconds, the duration of one backward stroke is 4 seconds, the duration of each of the interruptions is 80 milliseconds. In total, there are 10 forward strokes and 10 backward strokes (total time: 80 seconds) and 96 interruptions (total time: 7.68 seconds). The time of the interruption during a stroke has a duration of 9.6% of the total time of said stroke.

It should be noted that the main gas flow was not interrupted. The number and axial position of the start of these interruptions is shown in FIG. 3. Therefore, one or more aims of the present invention mentioned above have been reached. More embodiments of the present invention are cited in the appended claims.

What is claimed is:

1. A method for carrying out a plasma deposition process, comprising the steps of:
   i) providing a hollow substrate tube;
   ii) supplying a supply flow of dopant-containing glass-forming gases to the substrate tube of step i), wherein the supply flow comprises a main gas flow and one or more secondary gas flows, the main gas flow primarily comprising the glass-forming gases and the one or more secondary gas flows primarily comprising precursors for dopant(s);
   iii) inducing a plasma by means of electromagnetic radiation in at least a part of the substrate tube of step ii) to create a reaction zone in which deposition of one or more glass layers onto an interior surface of the substrate tube occurs;
   iv) moving the reaction zone back and forth in a longitudinal direction over the substrate tube between a reversal point located near the supply side and a reversal point located near the discharge side of the substrate tube, wherein each forward movement and back movement is a stroke;
   wherein the at least one or more secondary gas flows through a mass flow controller and a valve positioned between the mass flow controller and the hollow substrate tube, the mass flow controller maintaining a constant flow of the at least one secondary gas originating from the mass flow controller regardless of an opened or closed state of the valve;
   wherein the flow of the one or more secondary gas flows is interrupted by closing the valve one or more times during step iii), each interruption having a start point and an end point as a function of an axial position of the plasma along the length of the substrate tube;
   wherein the start point and the end point of each interruption both lie within the same stroke; and
   wherein each interruption has a duration of no more than 10% of a total time of the stroke thereby achieving uniform thickness and uniform refractive index profile of the deposited glass layers in an axial direction.

2. The method of claim 1, wherein the at least one secondary gas that is interrupted comprises a precursor for a germanium dopant.

3. The method of claim 1, wherein each interruption has a duration less than 10% of a total time of the stroke.

4. The method of claim 1, wherein each interruption has a duration less than 5% of a total time of the stroke.

5. The method of claim 1, wherein each interruption has a duration less than 2.5% of a total time of the stroke.

6. The method of claim 1, wherein each interruption has a duration less than 1.5% of a total time of the stroke.

7. The method of claim 1, wherein each interruption during multiple strokes occurs at the same axial position.

8. The method of claim 1, wherein each interruption is a fraction of the stroke of a phase.

9. The method of claim 8, wherein the interruptions are applied in no more than 75% of the strokes.

10. The method of claim 8, wherein the interruptions are applied in 5% to 75% of the strokes.

11. The method of claim 8, wherein the interruptions are applied in the forward strokes.

12. The method of claim 1, wherein a plurality of interruptions are applied in a single stroke.

13. The method of claim 1, wherein a control frequency of at least 20 Hz is used to control the valve.

14. The method of claim 1, wherein control of the valve occurs as a function of an axial position of the reaction zone in the substrate tube in step iii), the control occurring by comparing a previously determined refractive index profile in an axial direction with a refractive index profile, a difference between the two profiles functioning as a basis for interrupting the gas flow of at the one or more secondary gas flows.

15. The method of claim 1, wherein step i) is preceded by a calibration step o) comprising the following steps:
   a) providing a calibration substrate tube;
   b) obtaining a refractive index profile as a function of an axial position along the length of the calibration substrate tube;
   c) comparing the refractive index profile obtained in step b) with a predetermined refractive index profile; and
   d) determining one or more axial positions at which the one or more secondary gas flows is to be interrupted before providing the hollow substrate tube of step i).

* * * * *